United States Patent
Yach et al.

(10) Patent No.: US 10,418,438 B2
(45) Date of Patent: Sep. 17, 2019

(54) CAPACITOR STRUCTURE WITH AN EXTENDED DIELECTRIC LAYER AND METHOD OF FORMING A CAPACITOR STRUCTURE

(71) Applicant: Microchip Technology Incorporated, Chandler, AZ (US)

(72) Inventors: Randy Yach, Phoenix, AZ (US); Rohan Braithwaite, Gilbert, AZ (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 0 days.

(21) Appl. No.: 15/885,948

(22) Filed: Feb. 1, 2018

(65) Prior Publication Data

US 2018/0226469 A1    Aug. 9, 2018

Related U.S. Application Data

(60) Provisional application No. 62/456,764, filed on Feb. 9, 2017.

(51) Int. Cl.
| | |
|---|---|
| *H01L 29/94* | (2006.01) |
| *H01L 49/02* | (2006.01) |
| *H01G 4/33* | (2006.01) |
| *H01G 4/10* | (2006.01) |
| *H01G 4/12* | (2006.01) |

(52) U.S. Cl.
CPC ............ *H01L 28/60* (2013.01); *H01G 4/10* (2013.01); *H01G 4/1272* (2013.01); *H01G 4/33* (2013.01); *H01L 29/94* (2013.01); *H01L 28/40* (2013.01)

(58) Field of Classification Search
CPC .......... H01L 28/60; H01L 28/92; H01L 29/94
See application file for complete search history.

(56) References Cited

U.S. PATENT DOCUMENTS

| | | | |
|---|---|---|---|
| 6,177,716 B1 * | 1/2001 | Clark ................. | H01L 27/0805 257/249 |
| 9,978,764 B2 * | 5/2018 | Piazza .................... | H01L 28/60 |
| 2005/0179077 A1 | 8/2005 | Schnitt .......................... | 257/306 |

OTHER PUBLICATIONS

International Search Report and Written Opinion, Application No. PCT/US2018/017163, 15 pages, dated Jul. 10, 2018.

* cited by examiner

*Primary Examiner* — Mark V Prenty
(74) *Attorney, Agent, or Firm* — Slayden Grubert Beard PLLC

(57) ABSTRACT

A capacitor structure may include a lower conducting layer (e.g., poly 1 layer) and an upper conducting layer (e.g., overlying poly 2 layer), which define an anode and cathode, and a dielectric layer (e.g., an ONO layer stack) located between the upper conducting layer and the lower conducting layer, wherein a portion of the dielectric layer (e.g., at least the nitride layer of the ONO layer stack) extends beyond a lateral edge of the upper conducting layer. A method forming such capacitor structure may utilize a spacer adjacent the lateral edge of the upper conducting layer and over the first portion of the dielectric layer, performing an etch to remove a first portion of the dielectric layer but protect a second portion located below the spacer and extending laterally beyond an edge of the upper conducting layer.

12 Claims, 6 Drawing Sheets

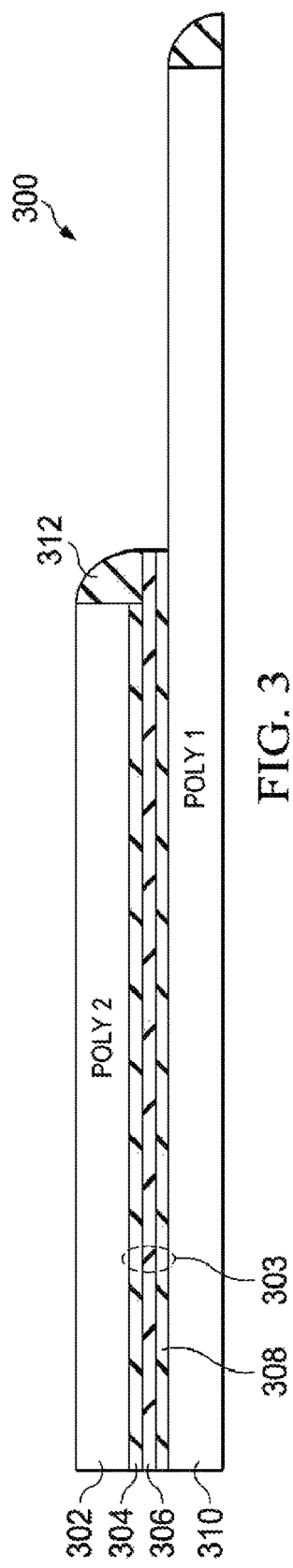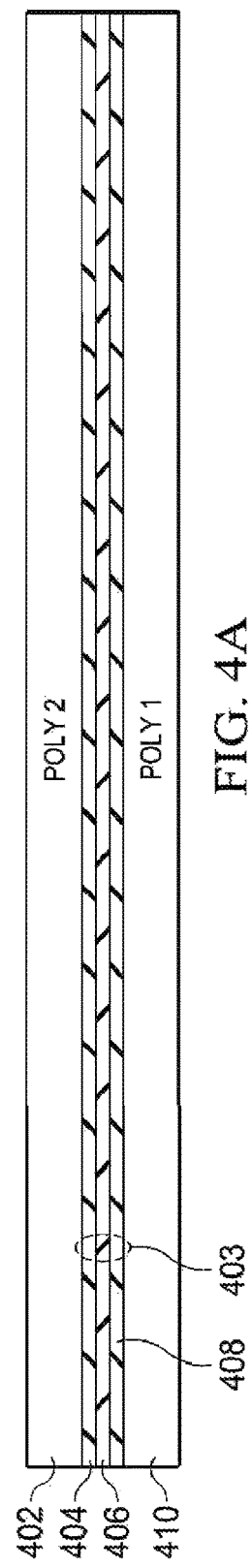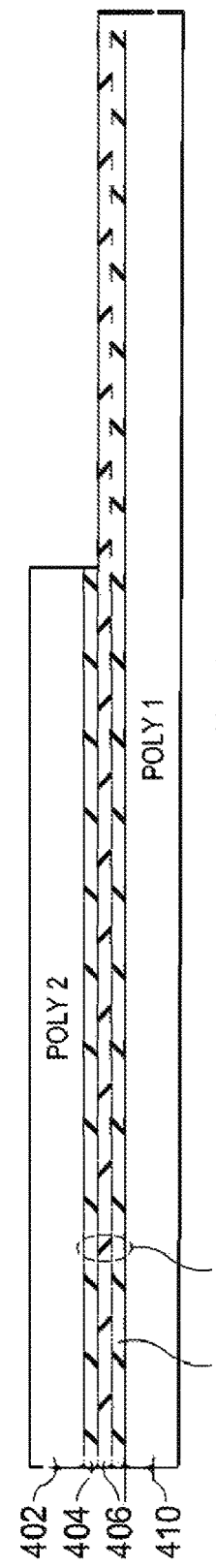
FIG. 3
FIG. 4A
FIG. 4B

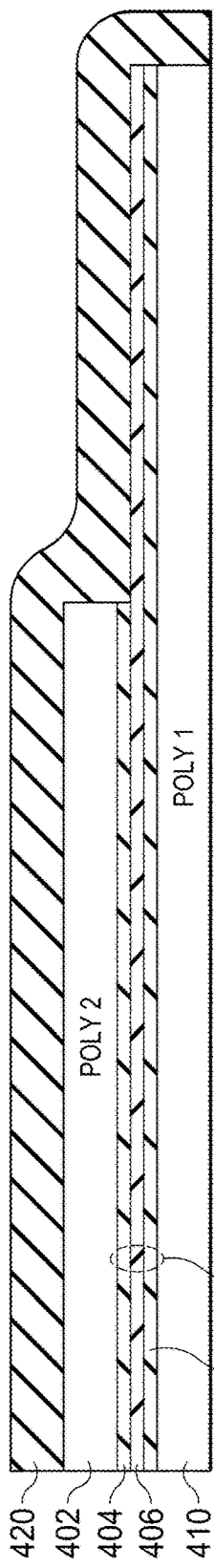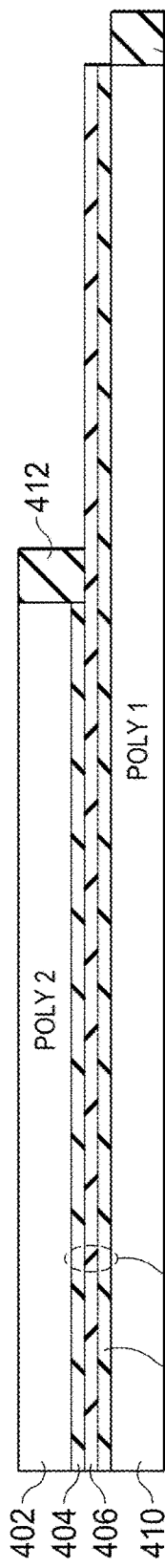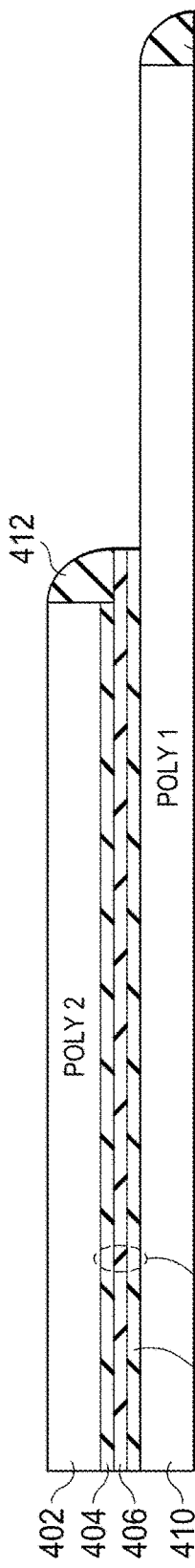

CAPACITOR STRUCTURE WITH AN EXTENDED DIELECTRIC LAYER AND METHOD OF FORMING A CAPACITOR STRUCTURE

RELATED PATENT APPLICATION

This application claims priority to commonly owned U.S. Provisional Patent Application No. 62/456,764; filed Feb. 9, 2017; which is hereby incorporated by reference herein for all purposes.

TECHNICAL FIELD

The present disclosure relates to processes for electronic device manufacture and, more particularly, to a capacitor structure having a dielectric layer or component(s) thereof (e.g., a silicon nitride layer of an ONO dielectric) extending beyond a lateral edge of an overlying conductive plate of the capacitor, e.g., embodied as a poly layer.

BACKGROUND

Various electronic devices include integrated circuit (IC) components including any number of capacitors formed therein. Some IC capacitors utilize a multilayer dielectric material between anode and cathode capacitive plates, e.g., an oxide-nitride-oxide (ONO) multilayer dielectric including a silicon nitride layer between a pair of oxide layers. Silicon nitride has a high dielectric constant, and may thus be used to increase the breakdown voltage of the capacitor, while keeping the capacitance the same. Certain conventional IC capacitors, including certain IC capacitors using ONO dielectric may include defects or characteristics that cause failures that result in leakage current in the capacitors, which may cause errors or failures in the capacitors and/or an end product in which the capacitors are included. These defects include defects at one or more edges of the capacitor structure, e.g., due to concentrated electric fields at such edge regions. Further, the incidence of failures resulting from such defects may increase as a function of higher voltage applications.

FIGS. 1A-1B and 2A-2B illustrate two example capacitors implemented by conventional processes and systems, and may suffer from the deficiencies discussed above. Each capacitor shown in FIGS. 1A-1B and 2A-2B includes a pair of conductor plates (e.g., positive plate and negative plate, or anode and cathode) embodied as a pair of conductive poly layers (a poly 2 layer over a poly 1 layer) separated by an oxide-nitride-oxide (ONO) layer. Defects may occur near a lateral edge of the poly 2 layer and underlying ONO layer. This region is circled in each of FIGS. 1A-1B and 2A-2B. It should be understood that in alternative embodiments the capacitor plates may be embodied by any suitable structures or materials other than polysilicon layers.

FIGS. 1A and 1B shows microscope images (e.g., taken using a tunneling electron microscope) of a cross-section of a first conventional capacitor structure 100 that may show signs of failure, and also exemplifies the undesirable properties mentioned above, e.g., errors due to field effects near the lateral edge of the poly 2 layer.

The example capacitor 100 includes a base poly silicon layer 110, an ONO structure (layer stack) 103 including an oxide layer 108, a silicon nitride (also referred to herein simply as nitride) layer 106, another oxide layer 104, and a top poly silicon layer 102. As shown in FIG. 1B, oxide layers 108 and 104 may remain separated at the lateral edge or sidewall of top poly silicon layer 102, and nitride layer 106 may extend to this lateral edge or sidewall. Thus, capacitor 100 may not yet have failed, but may experience unwanted field effects. For example, increasing electric lines at the edge of the capacitor may concentrate the field at point 112, which is represented as a brighter spot in FIG. 1B. Point 112 may include a void in the oxide due to heating in a different plane. This increased electric field may subsequently lead to an error or failure.

FIGS. 2A and 2B shows microscope images (e.g., taken using a scanning electron microscope) of a cross-section of a second conventional capacitor structure 200 that further demonstrates the weakness described due to normal process variations in the silicon nitride layer, resulting in narrow dielectric at the capacitor edge.

As with capacitor 100 shown in FIGS. 1A-1B, capacitor 200 includes a base poly silicon layer 210, an ONO structure 203 (layer stack) including an oxide layer 208, a nitride layer 206, another oxide layer 204, and a top poly silicon layer 202. FIG. 2B illustrates that the capacitor may fail at a much lower voltage than intended. The failure may include a convergence or breakthrough of oxide layers 208 and 204 at point 212, and nitride layer 206 might not extend fully to the sidewall or edge of top poly silicon layer 202. The failure to extend fully to the edge/sidewall, as well as the convergence of oxide layers 208, 204, may be an unintentional result of poor etching or other etching mistakes. Moreover, the failure may result from the high field effects shown in FIGS. 1A and 1B. Oxide layers 208 and 204 and nitride layer 206 may have been etched together, e.g., using an isotropic process wherein the etching is applied straight downward.

SUMMARY

Embodiments of the present disclosure are directed to an improved capacitor structure and method for forming an improved capacitor structure. For example, the improved capacitor structure may have a reduced likelihood of certain failures, e.g., the types of failures discussed above, and may thus provide a more reliable capacitor.

In certain embodiments, a nitride layer may be added to a capacitor during the production process to increase the breakdown voltage of the capacitor. The layer may be implemented using an improved oxide-nitride-oxide (ONO) structure, for example.

In some embodiments, the capacitor may be a MOS or MOS-style integrated capacitor. The capacitor may include properties of breakdown voltage as well as capacitance of the overall capacitor. The breakdown voltage may include a voltage at which, given an electric field strength, above such field strength the dielectric in a capacitor becomes conductive. The breakdown voltage is defined by the product of the dielectric strength and the distance between the conductors. The dielectric strength may be defined according to the particular substance used as a dielectric. The dielectric may be used in thin layers. The breakdown voltage may represent the maximum energy that can be stored in a capacitor. Breakdowns may occur when electric field strength congregates at a point in the capacitor. The breakdown voltage may decrease as the dielectric material becomes thinner. Using the same dielectric across different capacitors, as thickness decreases to increase capacitance, the breakdown voltage may also decrease. Capacitance and breakdown voltage may be inversely related. Using nitride as a dielectric, with a different dielectric constant, may be used with three times the normal thickness, allowing a capacitor to keep the same capacitance value (due to the improved dielectric constant value) while increasing the breakdown voltage (due to the thickness).

In some embodiments, the capacitor may include a lower poly layer (poly 1), an upper poly layer (poly 2), and an ONO structure including a nitride layer between the lower and upper poly layers. In some embodiments, the capacitor may be formed such that a portion of the nitride layer (including a terminal edge of the nitride layer) extends laterally beyond a lateral edge of the overlying upper poly layer. This structure, with the nitride layer extending laterally beyond the overlying upper poly layer, may reduce or eliminate certain failures or undesirable capacitor characteristics described above.

One embodiment provides a capacitor structure including an upper conducting layer, a lower conducting layer, and a dielectric layer located between the upper conducting layer and the lower conducting layer, wherein a portion of the dielectric layer extends beyond a lateral edge of the upper conducting layer.

In one embodiment, the dielectric layer comprises a nitride layer.

In one embodiment, the dielectric layer comprises a nitride layer of an oxide-nitride-oxide (ONO) structure arranged between the upper conducting layer and the lower conducting layer.

In one embodiment, the capacitor structure includes an oxide-nitride-oxide (ONO) structure arranged between the upper conducting layer and the lower conducting layer, the ONO structure including a lower oxide layer, a nitride layer, and an upper oxide layer, wherein the dielectric layer comprises the nitride layer of the ONO structure; wherein the upper oxide layer of the ONO structure does not extend beyond the lateral edge of the upper conducting layer.

In one embodiment, the capacitor structure further includes a spacer adjacent the lateral edge of the upper conducting layer and covering the portion of the dielectric extending beyond the lateral edge of the upper conducting layer.

In one embodiment, the spacer comprises an oxide.

In one embodiment, the capacitor structure includes an oxide-nitride-oxide (ONO) structure arranged between the upper conducting layer and the lower conducting layer, the ONO structure including a lower oxide layer, a nitride layer, and an upper oxide layer, wherein the dielectric layer comprises the nitride layer of the ONO structure; and a spacer adjacent the lateral edge of the upper conducting layer and covering the portion of the dielectric extending beyond the lateral edge of the upper conducting layer. The spacer may comprise a different oxide than the upper oxide layer of the ONO structure.

In one embodiment, a terminal edge of the dielectric layer extends beyond the lateral edge of the upper conducting layer in a first direction, and the lower conducting layer extends beyond the terminal edge of the dielectric layer in the first direction.

In one embodiment, the upper conducting layer and the lower conducting layer comprise polysilicon.

Another embodiment provides a method of forming a capacitor structure, including forming a lower conducting layer, forming a dielectric layer over the lower conducting layer, and forming an upper conducting layer over the dielectric layer. After forming the capacitor structure, a first portion of the dielectric layer extends beyond a lateral edge of the upper conducting layer.

In one embodiment, the method includes forming a spacer adjacent the lateral edge of the upper conducting layer and over the first portion of the dielectric layer; and performing etching to remove a second portion of the dielectric layer that extends laterally beyond the spacer, wherein the spacer protects the first portion of the dielectric layer from being removed by the etching; such that after the etching, the spacer and the first portion of the dielectric layer covered by the spacer extend beyond the lateral edge of the upper conducting layer.

In one embodiment, forming the spacer includes forming a spacer layer extending over at least a portion of the upper conducting layer and over the first and second portions of the dielectric layer; and partially removing the spacer layer to expose the second portion of the dielectric layer.

In one embodiment, forming the dielectric layer over the lower conducting layer comprises forming oxide-nitride-oxide (ONO) structure over the lower conducting layer, the ONO structure including a lower ONO oxide layer, a nitride layer, and an upper ONO oxide layer, wherein the dielectric layer comprises the nitride layer of the ONO structure such that a first portion of the nitride layer extends beyond the lateral edge of the upper conducting layer. The method may include forming a spacer adjacent the lateral edge of the upper conducting layer and over a first portion of the ONO structure that includes a first portion of the upper ONO oxide layer, the first portion of the nitride layer, and a second portion of the upper ONO oxide layer; and performing etching to remove (a) a second portion of the upper ONO oxide layer extending laterally beyond the spacer and (b) a second portion of the nitride layer extending laterally beyond the spacer.

In one embodiment, the etching process also removes some or all of a second portion of the lower ONO layer extending laterally beyond the spacer.

In one embodiment, the etching process also removes a portion of the spacer.

In one embodiment, forming the spacer comprises forming the spacer from a different oxide that the upper ONO oxide layer.

BRIEF DESCRIPTION OF THE FIGURES

Example aspects and embodiments are discussed below with reference to the drawings, in which:

FIG. 3 shows a schematic cross section of an improved capacitor structure, wherein a nitride layer extends laterally beyond a lateral edge of an overlying poly 2 layer, which may provide improved performance of the capacitor, according to embodiments of the present disclosure;

FIGS. 4A-4E show an example method of forming the improved capacitor structure shown in FIG. 3, according to one embodiment of the present disclosure.

DETAILED DESCRIPTION

Figure 1A:
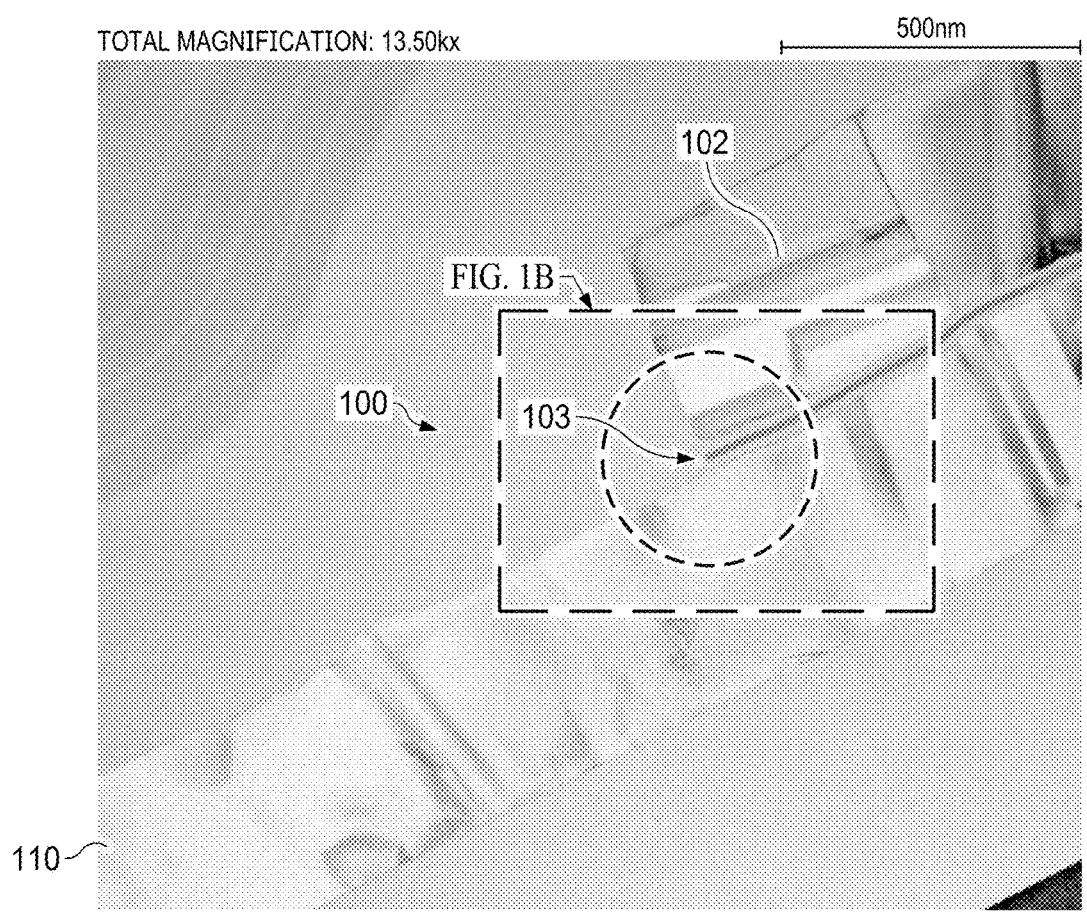
FIG. 1A shows a transmission electron microscope image of a cross-section of a conventional capacitor structure that has not yet failed but is starting to exhibit undesirable properties, e.g., errors due to field effects near the lateral edge of the poly 2 layer.
Figure 1B:
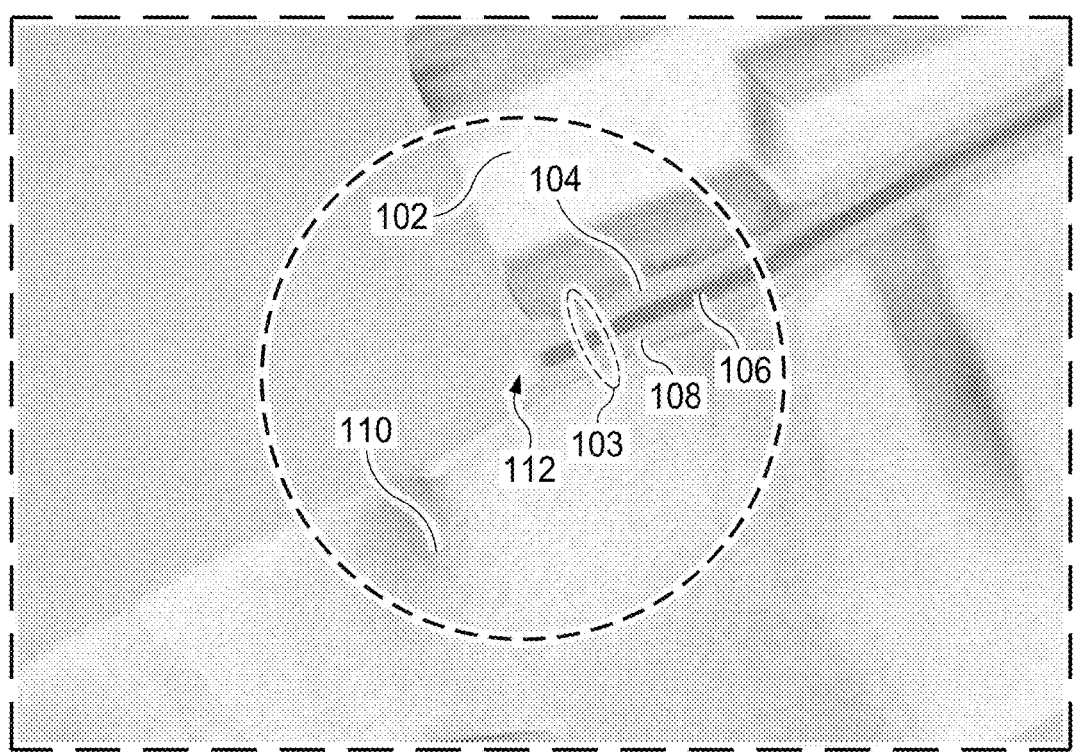
FIG. 1B shows a magnified view of the circled area shown in FIG. 1A.
Figure 2A:
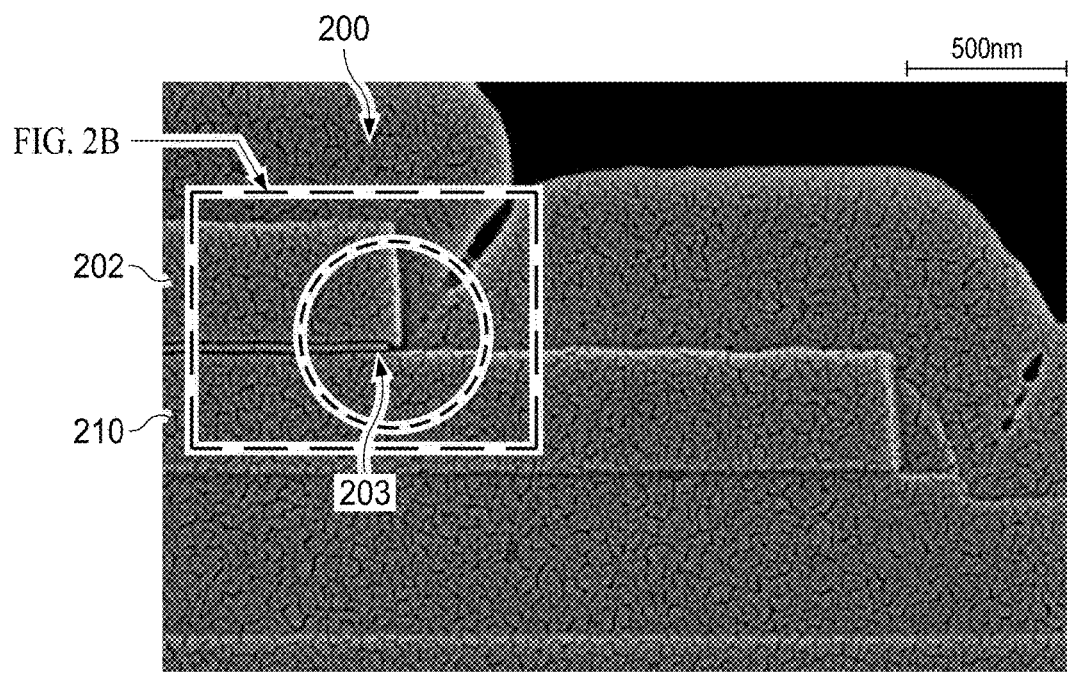
FIG. 2A shows a scanning electron microscope image of a cross-section of a conventional capacitor structure that has not yet failed, but will exhibit a lower breakdown voltage due to the missing nitride at the edge of the poly 2 layer.
Figure 2B:
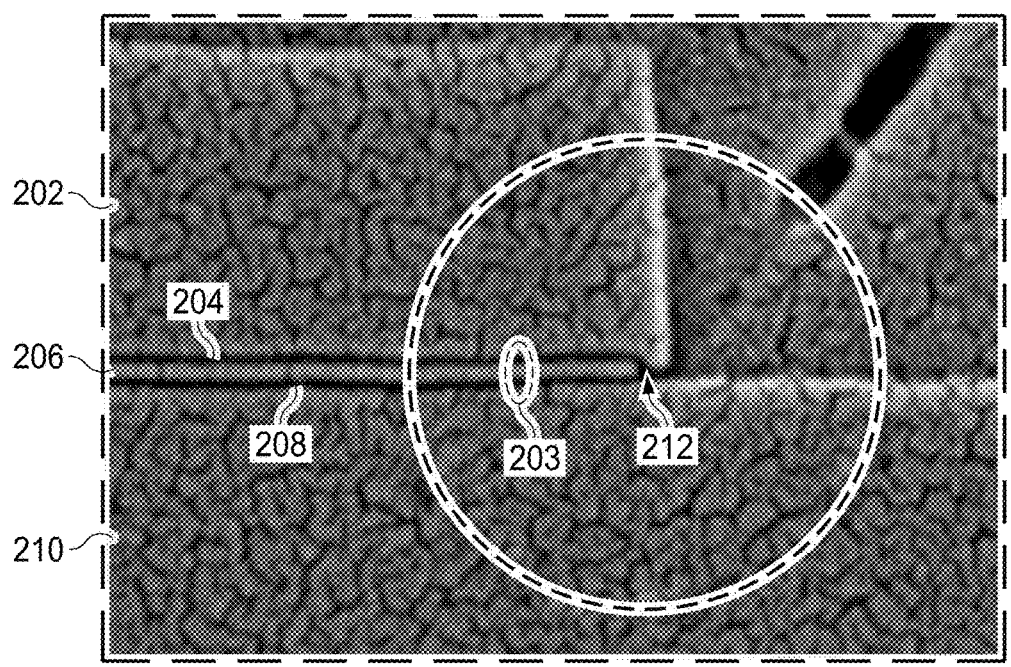
FIG. 2B shows a magnified view of the circled area shown in FIG. 2A.

FIG. 3 illustrates a cross section of an improved capacitor 300, according to embodiments of the present disclosure. Capacitor 300 may include a base poly silicon layer (poly 1) 310, an ONO structure 303 (layer stack) including a bottom oxide layer 308, a nitride layer 306, a top oxide layer 304, and a top poly silicon layer (poly 2) 302. In one embodiment, the bottom oxide layer 308 may be of a thermally grown oxide, and the top oxide layer 304 may be of a deposited oxide. In one embodiment, bottom oxide layer 308 and top oxide layer 304 may comprise an oxide other than borophosphosilicate glass (BPSG), as BPSG may be used to form other oxide layers, e.g., including an oxide spacer 312, as discussed in more detail below. In one embodiment, the nitride layer 306 may comprise a silicon nitride A process for forming these portions of the capacitor may include depositing or layering base poly silicon layer 310, depositing or layering oxide layer 308, depositing or layering nitride layer 306, and depositing or layering oxide layer 304. ONO structure 303 may be deposited or layered beyond the end or sidewall of the eventual top poly silicon layer 302, e.g., by using a spacer 312 may be deposited or formed on ONO structure 303. Spacer 312 may be include BPSG or another suitable oxide layer.

Accordingly, nitride layer 306 of ONO structure 303 extends laterally beyond from poly layer 302. Thus, etches or defects may be prevented from forming a path from layers 302 and 310.

FIGS. 4A-4E show an example method of forming the improved capacitor structure shown in FIG. 3, according to one embodiment of the present disclosure.

As shown in FIG. 4A, a bottom poly silicon layer 410 may be formed; an ONO structure 403 may be formed over the poly silicon layer 410, the ONO structure 403 including a lower oxide layer 408, a nitride layer 406, and an upper oxide layer 404; and a top poly silicon layer (poly 2) 402 may be formed over the ONO structure 403.

As shown in FIG. 4B, upper poly layer 402 may be etched such that the ONO structure 403 extends laterally beyond the edge of poly layer 402. For example, the etch may be selective to stop at nitride layer 406, such that the upper oxide layer 404 underlying the removed portion of the upper poly layer 402 is removed by the etch. Removal of the upper oxide layer 404 adjacent the lateral edge of upper poly layer 402 may help provide improved performance (e.g., reduced failure rate) of the resulting capacitor, as discussed below.

Then, one or more steps may be performed to form a spacer 412 laterally adjacent the lateral edge of upper poly layer 402, and remove portions of the underlying nitride layer 406, such that the spacer 412 protects a portion of nitride layer 406 extending laterally beyond the overlying upper poly layer 402 from being etched away. The resulting structure, e.g., as shown in FIG. 4E, includes nitride layer 406 that extends laterally beyond the overlying upper poly layer 402, which may reduce or eliminate certain failures or undesirable capacitor characteristics described above.

In some embodiments, e.g., as discussed below with reference to FIGS. 4C-4E, spacer 412 is formed by depositing a spacer oxide layer and then performing one or more etches. In other embodiments, spacer 412 may be formed in any other manner, e.g., by depositing oxide or other suitable material locally adjacent the lateral edge of upper poly layer 402.

As shown in FIG. 4C, a spacer oxide layer 420 may be deposited over the structure. Spacer oxide layer 420 may comprise borophosphosilicate glass (BPSG) or another suitable oxide layer. In some embodiments, spacer oxide layer 420 is formed from a different oxide than oxide layers 404 and 408 of ONO 403. In other embodiments, spacer oxide layer 420 is formed from the same oxide as oxide layers 404 and 408 of ONO 403.

One or more etch processes (discussed below with reference to FIGS. 4D and 4E) may then be performed to remove portions of the spacer oxide layer 420 and underlying nitride layer 406, wherein a portion of the spacer oxide layer 420 near the lateral edge of upper poly layer 402 (i.e., near the step-down from upper poly layer 402 to lower poly layer 410) may act as a spacer 412 to protect a portion of nitride layer 406 extending laterally beyond the overlying upper poly layer 402 from being etched away. Thus, as shown in FIG. 4E, after the etch process(es), the lateral edge of nitride layer 406 may be coincident with the lateral edge of spacer 412, and thus extend laterally beyond the overlying upper poly layer 402.

In one embodiment, multiple etch processes may be performed on the structure shown in FIG. 4C to provide the resulting structure shown in FIG. 4E, in which nitride layer 406 extends laterally beyond the lateral edge of upper poly layer 402. For example, with reference to FIG. 4D, an oxide etch (which may be selective to nitride to protect nitride layer 406 from being etched) may be performed to remove portions of spacer oxide layer 420 to define spacer 412; and then with reference to FIG. 4E, a nitride etch may be performed to remove the portion of nitride layer 406 extending laterally beyond oxide spacer 412. The nitride etch may be an isotropic etch or other suitable etch. The nitride etch may be selective to poly layers 402 and 410 and may or may not be selective to oxide spacer 412. In addition to removing the portion of nitride layer 406 extending laterally beyond oxide spacer 412, the nitride etch may remove a portion or all of lower ONO oxide layer 408 underneath the portion of nitride layer 406 extending laterally beyond oxide spacer 412. The nitride etch may also remove some portions of spacer 412 such that it has a curved shape as shown in FIG. 4E. In other embodiments, the oxide etch performed on the structure shown in FIG. 4C (rather than the subsequent nitride etch) may result in the curved shape of spacer 412.

In another embodiment, a single etch processes may be performed on the structure of FIG. 4C to provide the structure of FIG. 4E, thereby skipping the state shown in FIG. 4D.

With reference to the resulting capacitor structure shown in FIG. 4E, the lateral separation of the terminal edge of nitride layer 406 from the lateral edges of the upper poly layer 402 may reduce or eliminate the field effects in this region discussed above with respect to conventional capacitor structures.

Figure 5:
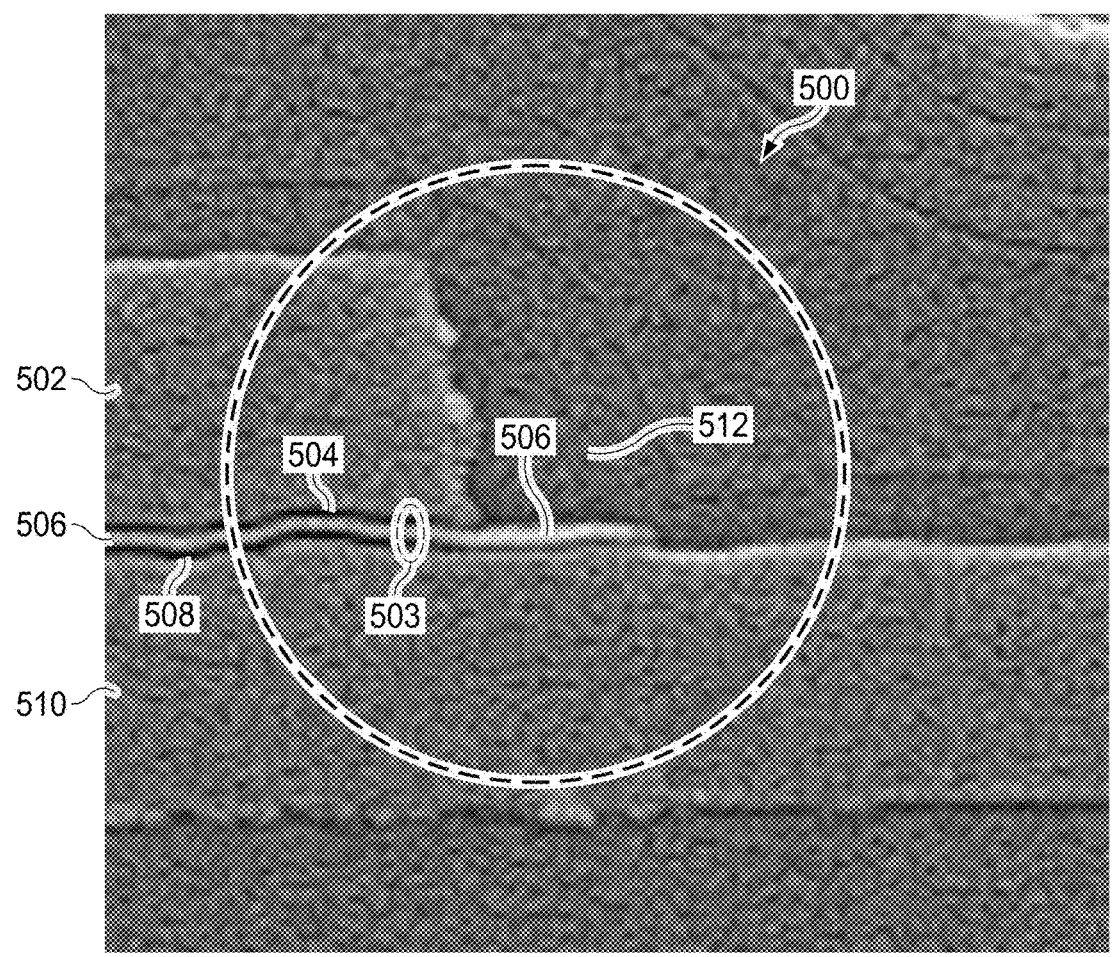
FIG. 5 shows a scanning electron microscope image of a cross-section of an example capacitor structure of the present disclosure, e.g., produced according to the method shown in FIGS. 4A-4E.

FIG. 5 shows a capacitor 500 according to example embodiments. Capacitor 500 may include a base poly silicon layer 510, an ONO structure 503 (layer stack) including a lower oxide layer 508, a nitride layer 506, and an upper oxide layer 504, and a top poly silicon layer 502. Spacer 512 may cover and protect nitride layer 506, such that spacer 512 and an underlying portion of nitride layer 506 extend laterally beyond a lateral edge of top poly silicon layer 502.

The invention claimed is:

1. A capacitor structure, comprising:
   an upper conducting layer;
   a lower conducting layer;
   an oxide-nitride-oxide (ONO) structure located between the upper conducting layer and the lower conducting layer, the ONO structure including a lower oxide layer, a nitride dielectric layer, and an upper oxide layer;
   wherein a portion of the nitride dielectric layer extends beyond a lateral edge of the upper conducting layer; and
   a spacer adjacent the lateral edge of the upper conducting layer and covering the portion of the nitride dielectric extending beyond the lateral edge of the upper conducting layer;
   wherein the spacer comprises a different oxide than the upper oxide layer of the ONO structure.

2. The capacitor structure of claim 1, wherein the upper oxide layer of the ONO structure does not extend beyond the lateral edge of the upper conducting layer.

3. The capacitor structure of claim 1, wherein a portion of the lower oxide layer of the ONO structure below the portion of the nitride dielectric layer extends beyond the lateral edge of the upper conducting layer.

4. The capacitor structure of claim 1, wherein:
   a terminal edge of the nitride dielectric layer extends beyond the lateral edge of the upper conducting layer in a first direction; and
   the lower conducting layer extends beyond the terminal edge of the nitride dielectric layer in the first direction.

5. The capacitor structure of claim 1, wherein the upper conducting layer and the lower conducting layer comprise polysilicon.

6. The capacitor structure of claim 1, wherein the lower conducting layer comprises a poly 1 layer, and the upper conducting layer comprises a poly 2 layer.

7. A capacitor structure, comprising:
   an upper conducting layer;
   a lower conducting layer;
   an oxide-nitride-oxide (ONO) structure located between the upper conducting layer and the lower conducting layer, the ONO structure including a lower oxide layer, a nitride dielectric layer, and an upper oxide layer;
   wherein a lateral edge of the nitride dielectric layer extends beyond an outer lateral edge of the upper conducting layer, such that the upper conducting layer does not overlie the lateral edge of the nitride dielectric layer; and
   a spacer adjacent and in contact with the outer lateral edge of the upper conducting layer and covering a lateral end region of the nitride dielectric that extends laterally from the outer lateral edge of the upper conducting layer to the lateral edge of the nitride dielectric layer.

8. The capacitor structure of claim 7, wherein the spacer comprises an oxide layer.

9. The capacitor structure of claim 7, wherein the spacer comprises a different oxide than the upper oxide layer of the ONO structure.

10. The capacitor structure of claim 7, wherein the upper oxide layer of the ONO structure does not extend beyond the lateral edge of the upper conducting layer.

11. The capacitor structure of claim 7, wherein a portion of the lower oxide layer of the ONO structure below the lateral end region of the nitride dielectric layer extends beyond the lateral edge of the upper conducting layer.

12. The capacitor structure of claim 7, wherein:
   the lateral end region of the nitride dielectric layer extends beyond the lateral edge of the upper conducting layer in a first direction; and
   the lower conducting layer extends beyond the lateral end region of the nitride dielectric layer in the first direction.

* * * * *